(12) United States Patent
Miyatake et al.

(10) Patent No.: US 6,262,929 B1
(45) Date of Patent: Jul. 17, 2001

(54) PRE-CHARGING CIRCUIT AND METHOD FOR A WORD MATCH LINE OF A CONTENT ADD RESSABLE MEMORY (CAM)

(75) Inventors: Hisatada Miyatake, Ohtsu; Masahiro Tanaka, Moriyama; Yohtaro Mori, Shiga-ken, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/495,659

(22) Filed: Feb. 1, 2000

(30) Foreign Application Priority Data

Feb. 5, 1999 (JP) .................................................. 11-028315

(51) Int. Cl.$^7$ ....................................................... G11C 7/00
(52) U.S. Cl. ............................................. 365/203; 365/49
(58) Field of Search ................................ 365/49, 203, 226

(56) References Cited

U.S. PATENT DOCUMENTS 5,617,348 * 4/1997 Maguire .................................. 365/49

* cited by examiner

*Primary Examiner*—Vu A. Le
*Assistant Examiner*—VanThu Nguyen
(74) *Attorney, Agent, or Firm*—Steven Capella

(57) ABSTRACT

In a content addressable memory (CAM) where a bit (called a valid bit) indicating whether the data of a word is valid is provided to the word, when the valid bit indicates that the word is invalid, pre-charging is controlled so that pre-charging of the match line of the word may be prohibited. At the same time, the match line is forcibly put into a mismatch state. With this arrangement, the power dissipation for the searching operation at a data word that is not a search object is eliminated, whereby the power dissipation for the operation of searching the entire CAM is reduced. Thus, a reduction in the average power dissipation for a CAM searching operation is achieved without having any influence on CAM performance.

4 Claims, 3 Drawing Sheets

PRE-CHARGING CIRCUIT AND METHOD FOR A WORD MATCH LINE OF A CONTENT ADDRESSABLE MEMORY (CAM)

FIELD OF THE INVENTION

The present invention relates to a pre-charging circuit and method for a word match line (also called a match line) of a content addressable memory (CAM) of a semiconductor circuit, and furthermore a CAM word circuit including the pre-charging circuit.

BACKGROUND OF THE INVENTION

The CAM is a memory device that can search for stored data that match the reference data and read out information related to the matching data, such as an address indicating where the matching data is stored. With advancement of semiconductor technologies, there is a demand for CAMs with higher speed and less power dissipation.

A bit, indicating whether or not a word (which is a storing unit consisting of a plurality of bits specified by an address) is valid for, is often attached to each word of the CAM. This bit is called a "valid bit" and normally stored in a memory cell called a "valid cell," provided in the CAM.

Normally, the valid bit attached to a word is controlled so that it may be set to a "true" value when valid data is written to the word. In other words, the "true" value (e.g., a bit "1") of the valid bit is stored in the valid cell. In addition, resetting to a "false" value is performed either by resetting the valid bits of all the words at once or by resetting the valid bit one by one for each word. In other words, the valid bit in the valid cell is set to a "false" value (e.g., a bit "0").

FIG. 1 is a diagram showing a conventional word configuration of a CAM having a valid cell. In the CAM of FIG. 1, when a searching operation is performed, both the signal from a word match line 1 indicating the match or mismatch of a word and the output of the valid bit held in the valid cell 2 are input to a NAND gate 3 and the logical AND operation between them is performed.

FIG. 2 is a diagram showing another conventional word configuration of a CAM having a valid cell. The CAM of FIG. 2 has the configuration where a valid cell 2 is connected to a word match line in parallel with other CAM cells within a word and connect to inverter pair 4. In this case, the "true" value of the valid bit is equated to a match in other bits within the word, while the "false" value of the valid bit is equated to a mismatch in other bits within the word.

The conventional methods of FIGS. 1 and 2 can attain the functional object of the operation of searching for a word matching input data from among valid words. These methods, however, have the disadvantage that power is wastefully dissipated, because the searching operation is done also for invalid words and the match lines are charged and discharged there. There are match lines by the number of addresses. The parasitic capacitance of the match line is large when the width of the word is big, for instance, when it is as big as 64 bits. Therefore, if there are a greater number of invalid words, power dissipation will become greater and wasteful heat will be generated.

Thus, there is a need ways to attain a reduction in the average power dissipation for the CAM searching operation without having impact on CAM performance. There is also a need for a circuit and a method which control pre-charging of a word match line of a CAM by employing a valid bit.

SUMMARY OF THE INVENTION

According to the present invention, there is provided a pre-charging circuit for a word match line of a content addressable memory (CAM) having valid cells, comprising means for controlling pre-charging of the word match line in accordance with the valid bit stored in the valid cell.

According to the present invention, there is provided a CAM word circuit with a valid cell, comprising: a word match line; a plurality of CAM cells each connected in parallel to the word match line; and a pre-charging circuit connected to the word match line, the pre-charging circuit controlling pre-charging of the word match line in accordance with a valid bit stored in the corresponding valid cell.

According to the present invention, there is provided a method of pre-charging a word match line of a CAM having valid cells, comprising the steps of: storing a valid bit in the valid cell; and pre-charging the word match line in accordance with the valid bit stored in the valid cell.

These and other aspects of the invention are described in further detail below.

DETAILED DESCRIPTION OF THE INVENTION

Referring now to the accompanying drawings, preferred embodiments according to the present invention will be described in detail below.

Figure 1:
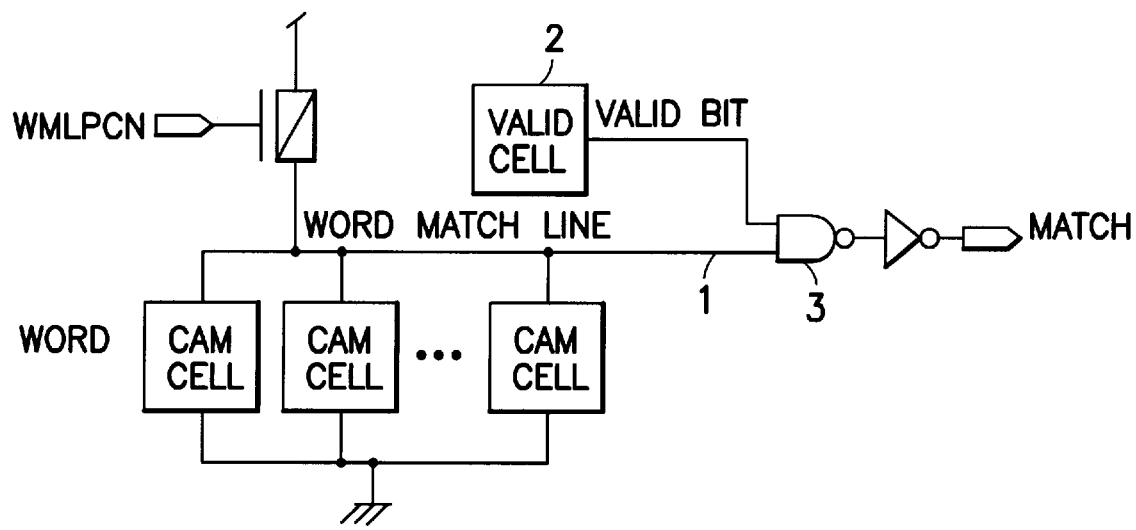
FIG. 1 is diagram showing a conventional word configuration of a CAM having a valid cell.
Figure 2:
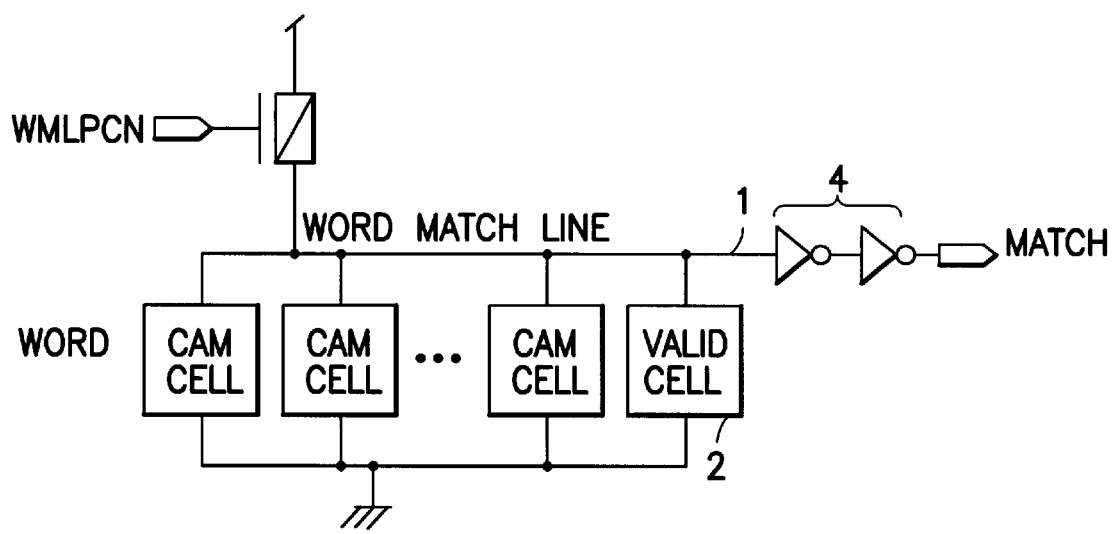
FIG. 2 is a diagram showing another conventional word configuration of a CAM having a valid cell.
Figure 3:
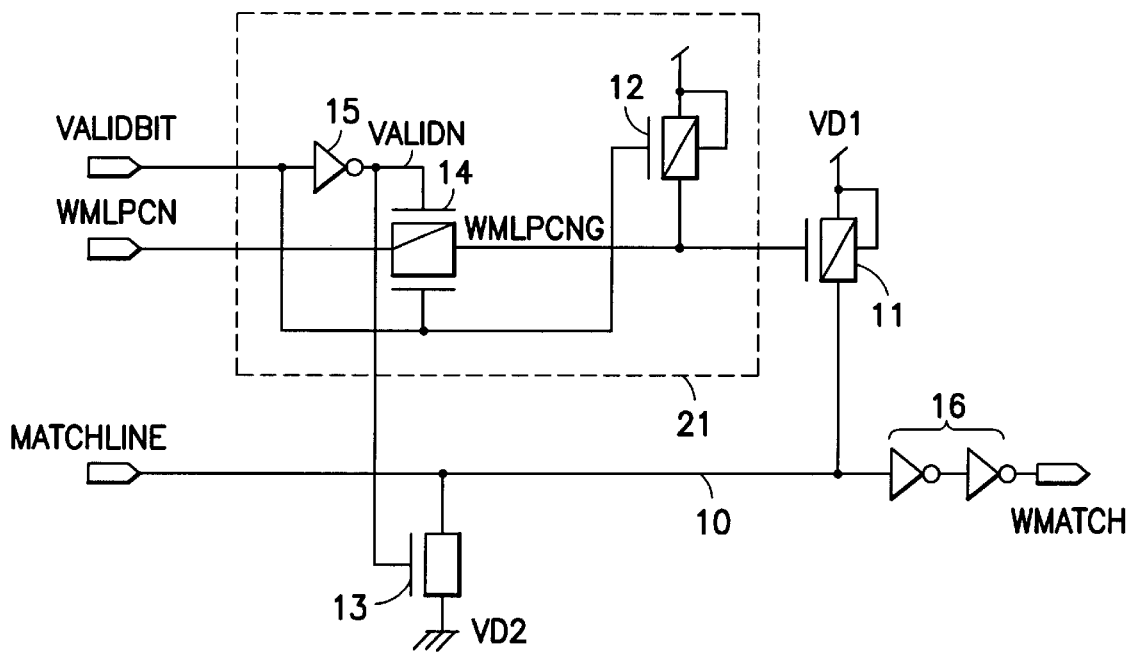
FIG. 3 is a diagram showing an embodiment of a pre-charging circuit for a word match line in a CAM word circuit of the present invention.

FIG. 3 is a diagram showing an embodiment of a pre-charging circuit for a word match line in a CAM word circuit of the present invention. Note that the pre-charging circuit of FIG. 3 is applicable for both the cell configuration in the CAM word circuit provides the valid cell independently of the CAM cells as shown in FIG. 1 or the valid cell line in parallel with the CAM cells as in FIG. 2. Also, in FIG. 3, assume a general CAM word configuration method that when a word matches input data the match line stays at a high level and when it does not match input data the match line is discharged to a low level.

The pre-charging circuit of the present invention in FIG. 3 is configured with a first switch 11 comprising a p-type FET connected to both a word match line 10 and a first pre-charging power source VD1, a control circuit 21 to turn on or off the first switch enclosed by a broken line, and a second switch 13 comprising an n-type FET connected to both the word match line 10 and a second pre-charging power source VD2 (normally, ground). The control circuit 21 is configured by a p-type FET 12, a transfer gate 14, and an inverter 15. Furthermore, in FIG. 3 containing the pre-charging circuit the output of the word match line 10 is transferred as a match signal (WMATCH) line through two inverters 16.

The characteristic of the pre-charging circuit of the present invention in FIG. 3 is that when a valid bit (VALIDBIT) indicates a "true" value, a match line precharging signal (WMLPCN) effectively acts on the precharging circuit for the word. Another characteristic is that when the valid bit (VALIDBIT) indicates a "false" value, the match line 10 and the pre-charging source (VD1) for the word are disconnected so that the match line 10 may not be pre-charged.

Furthermore, the characteristic of the pre-charging circuit of the present invention in FIG. 3 is that when the valid bit (VALIDBIT) indicates a "false" value, the match line 10 for the word goes to a "mismatch" state regardless of the match or mismatch of other bits of the word. Another characteristic is that when the valid bit (VALIDBIT) indicates a "true" value, the match line 10 is controlled so that the valid bit (VALIDBIT) may not have influence on judgment of the match or mismatch of the word.

Even if a NAND gate or inverter that is a primitive gate is employed, the above-mentioned logic function is realizable. The circuit in FIG. 3 is a circuit in which a delay of release or start of pre-charging of the match line is very small (or actually negligible) even if pre-charging of the match line is controlled by the valid bit, and practically, there is no impact on the speed of the searching operation.

A description will next be made of the operation of the pre-charging circuit of the present invention in FIG. 3.

When the switch 11 comprising a p-type FET is turned on, the word match line 10 is charged. When the valid bit (VALIDBIT) is "true" (in this embodiment, "high"), the transfer gate 14 goes to a conducting state. At the same time, the p-type FET 12 is turned on, also the n-type FET 13 is turned off, and the match line 10 is controlled by both the pre-charging signal (WMLPCN) and cells connected to the match line. During the pre-charging period, the match line pre-charging signal (WMLPCN) goes low and each cell does not drive the match line at all, so the match line 10 is charged through the p-type FET 11.

In the searching operation, the pre-charging signal (WMLPCN) goes high and therefore the p-type FET 11 is turned off, and the cell of the bit not matching input data bit causes the match line to be low Therefore, if in the word there is a single cell with a bit not matching input data bit, the match line 10 goes low. The cell with a bit matching input data bit does not drive the match line 10. Therefore, the match line for a word having all the bits matching with input data stays at a high level that is a pre-charged state.

When the valid bit (VALIDBIT) is "false" (in this embodiment, "low"), the transfer gate 14 goes to a nonconducting state and the p-type FET 12 is turned on. In this case, since the node WMLPCNG goes high, the p-type FET 11 is turned off. Also, since the node VALIDN is high, the n-type FET 13 is turned on and the match line 10 is fixed at a low level and indicates a "mismatch." Since it is denied by the valid bit that the word will match input word, the match is not be searched for. And as long as the valid bit (VALIDBIT) is "false," the match line 10 is fixed at a low level and disconnected from the power supply line, and therefore there is no power dissipation in the match line 10.

Figure 4:
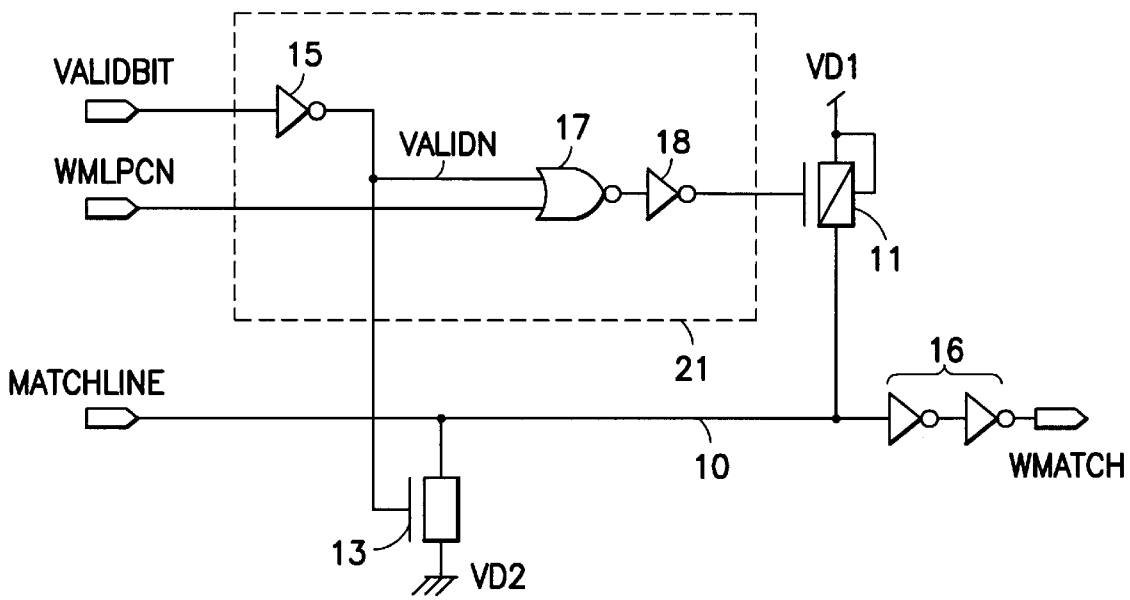
FIG. 4 is a diagram showing another embodiment of the pre-charging circuit for a word match line in a CAM word circuit of the present invention.

FIG. 4 is a diagram showing another embodiment of the pre-charging circuit for a word match line in a CAM word circuit of the present invention. Note that the pre-charging circuit of FIG. 4 is applicable for both if the cell configuration in the CAM word circuit provides the valid cell independently of the CAM cells as shown in FIG. 1 or the valid cell to in parallel with the CAM cells as shown in FIG. 2. Also, in FIG. 4, assume a general CAM word configuring method that when a word matches input data the match line stays at a high level and when it does not match input data the match line is discharged to a low level.

The circuit in FIG. 4 differs from that in FIG. 3 in that the control circuit 21 is configured with only primitive logic gates 15, 17, and 18. In the circuit of FIG. 4, the control of pre-charging the match line 10 delays by the amount of the delay of the NOR gate 17 and inverter 18 after the precharging signal (WMLPCN) was driven. However, when the delay is no problem or when the pre-charging signal (WMLPCN) can be driven earlier in anticipation of that delay, there is no great functional problem. But, the number of transistors (FET) to be used is increased and the area required for realizing the circuit is increased.

Figure 5:
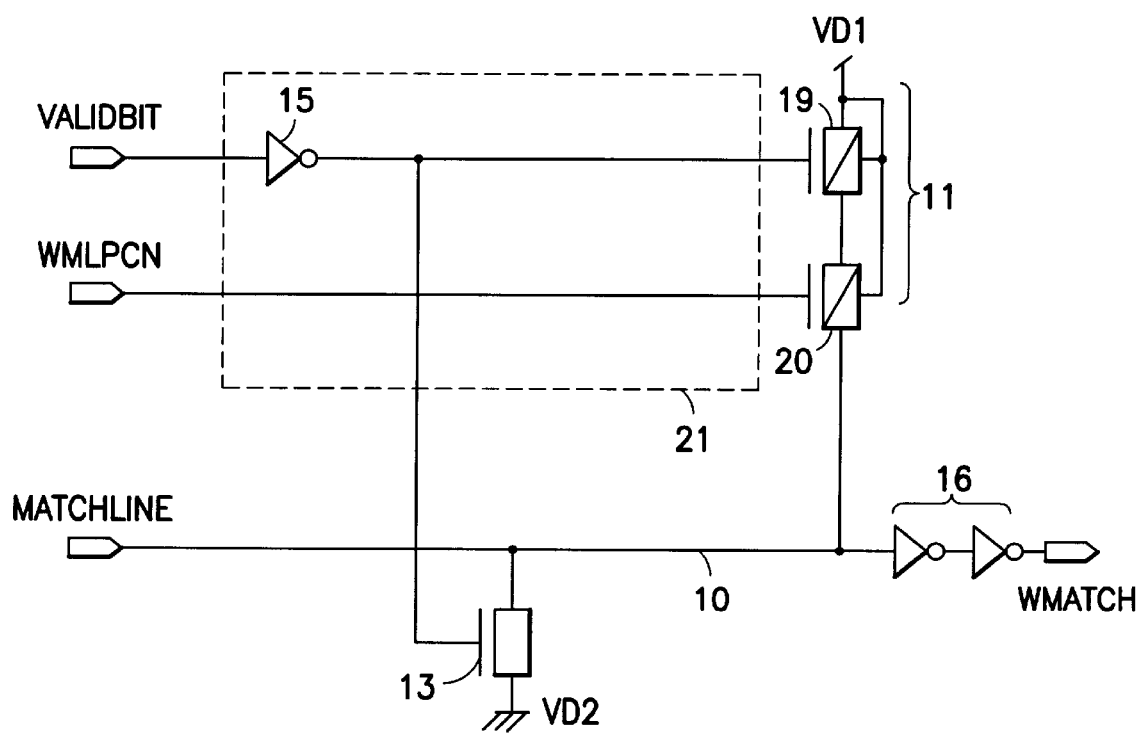
FIG. 5 is a diagram showing still another embodiment of the pre-charging circuit for a word match line in a CAM word circuit of the present invention.

FIG. 5 is a diagram showing still another embodiment of the pre-charging circuit for a word match line in a CAM word circuit of the present invention. The circuit in FIG. 5 differs from those shown in FIGS. 3 and 4 in that a switch 11, connected to both a word match line 10 and a first pre-charging power source VD1, is configured with two p-type FETs 19 and 20 connected in series and in that a control circuit 21 is configured by employing a single logic gate (inverter) 15 alone. In the circuit of FIG. 5, in order to pre-charge the match line 10 at the same speed as the circuit of FIG. 3, there is a need to increase the driving power of the p-type FETs 19 and 20 (in a simple method, a channel width) to about twice the p-type FET 11 of the circuit in FIG. 3.

An advantage of employing a method of controlling a match line and the pre-charging of the match line based on a valid bit of the present invention is that the average power dissipation for the CAM searching operation can be reduced. Usually in the CAM with a valid bit for each word, valid data are written after all the valid bits have been reset. Data are written as needed, and data are not always written to all addresses. When a certain set of operations ends, all the valid bits are reset and valid data are written again. Therefore, taking a time average, it can be expected that about half the addresses have valid data (i.e., the valid bits are true at about half the memory locations), although it depends upon the usage of the CAM. In that case, as for the amount of power required for the searching operation, the amount of power related to charging and discharging of the match line is reduced by about half on average.

For example, if a CAM with 2048 words ×64 bits is constructed on a 0.35 $\mu$m CMOS technology, the load on the word match line will be about 0.2 pF per line. When the searching operation is performed at 66 MHz, if mismatches are obtained at 2000 words, the power required for charging and discharging the word match line is $$66 \text{ MHz} \times (0.2 \text{ pF} \times 2000) \times (3.3 \text{ V})^2 = 287.5 \text{ mW}$$

in the case of conventional arts. Therefore, according to the circuit of the present invention, the power can be reduced to about 145 mW, which is half of 287.5 mW. In addition, although the power in the case of valid data being present in all addresses, i.e., peak power, cannot be reduced, average power can be reduced and therefore generation of heat is suppressed. As a result, when there is a margin from the viewpoint of thermal design and peak power, the operating speed of the CAM can be enhanced.

Having described the embodiments according to the present invention with reference to the accompanying drawings, the present invention is not limited to the illustrated circuits and methods. It will be apparent to those skilled in the art that various changes, modifications, and improvements can be made thereto without departing from the spirit or scope of the present invention.

What is claimed is:

1. A pre-charging circuit for a word match line of a content addressable memory (CAM) having valid cells, comprising:
   (a) a first switch provided between a first pre-charging power source and a word match line; and
   (b) a control circuit to receive a valid bit signal and a pre-charging signal and turn on or off said first switch in accordance with said signals, said control circuit comprising (i) an inverter receiving said valid bit signal, (ii) a transfer gate receiving said valid bit signal an inverted valid bit signal, and said precharging signal, and (iii) a p-type FET having a gate receiving said valid bit signal and a source/drain connected to an output from said transfer gate.

2. The pre-charging circuit as set forth in claim 1, further comprising a second switch provided between said word match line and a second power source, the second switch being turned on or off in accordance with the valid bit.

3. A CAM word circuit with a valid cell, comprising:
   a word match line;
   a plurality of CAM cells each connected in parallel to said word match line; and
   a pre-charging circuit connected to said word match line, said pre-charging circuit comprising:
   (a) a first switch provided between a first pre-charging power source and said word match line; and
   (b) a control circuit to receive a valid bit signal and a pre-charging signal and turn on or off said first switch in accordance with said signals, said control circuit comprising (i) an inverter receiving said valid bit signal, (ii) a transfer gate receiving said valid bit signal an inverted valid bit signal, and said precharging signal, and (iii) a p-type FET having a gate receiving said valid bit signal and a source/drain connected to an output from said transfer gate.

4. The CAM word circuit as set forth in claim 3, wherein said pre-charging circuit further includes a second switch provided between said word match line and a second power source, the second switch being turned on or off in accordance with the valid bit.

* * * * *